United States Patent [19]
Pantelakis et al.

[11] Patent Number: 5,777,935
[45] Date of Patent: Jul. 7, 1998

[54] MEMORY DEVICE WITH FAST WRITE RECOVERY AND RELATED WRITE RECOVERY METHOD

[75] Inventors: Dimitris C. Pantelakis; William L. Martino, Jr.; Derrick Leach; Frank A. Miller; Wai T. Lau, all of Austin, Tex.

[73] Assignee: Motorola, Inc., Schaumburg, Ill.

[21] Appl. No.: 815,527

[22] Filed: Mar. 12, 1997

[51] Int. Cl.⁶ .................................................. G11C 7/00
[52] U.S. Cl. .................. 365/203; 365/204; 365/202; 365/205
[58] Field of Search ........................ 365/203, 202, 365/204, 205

[56] References Cited

U.S. PATENT DOCUMENTS

| | | | |
|---|---|---|---|
| 4,110,840 | 8/1978 | Abe et al. | 365/203 |
| 5,043,945 | 8/1991 | Bader | 365/190 |
| 5,416,744 | 5/1995 | Flannagan et al. | 365/203 |

OTHER PUBLICATIONS

Kiyofumi Ochii et al., "An Ultralow Power 8K ×8–Bit Full CMOS RAM with a Six–Transistor Cell", IEEE Journal of Solid–State Circuits, vol. SC–17, No. 5, Oct. 1992, pp. 798–801.

*Primary Examiner*—Viet Q. Nguyen
*Attorney, Agent, or Firm*—Paul J. Polansky; Daniel D. Hill

[57] ABSTRACT

A memory (10) such as a current sensing static random access memory (SRAM) achieves fast write recovery through bit line loads and two additional mechanisms. First, an additional load (252) on shared data lines also becomes active to speed the write recovery process. Second, multiple columns (200, 202, 204) are connected to common data lines during write recovery so that a column written to during a write cycle may be again precharged in part by charge sharing using the charge stored in other columns. These two mechanisms allow fast write recovery with minimum column pitch and avoid the problems which would be encountered if the loads were placed on the write data line.

20 Claims, 4 Drawing Sheets

MEMORY DEVICE WITH FAST WRITE RECOVERY AND RELATED WRITE RECOVERY METHOD

CROSS REFERENCE TO RELATED, COPENDING APPLICATION

The present application is related to the following U.S. patent application:

"CIRCUIT AND PROCESS FOR SENSING DATA", invented by Dimitris C. Pantelakis, Wai Tong Lau, and John Eagan, Attorney Docket No. SC-90090A, application Ser. No. 08/815,526 filed concurrently herewith and assigned to the assignee hereof.

FIELD OF THE INVENTION

The present invention relates in general to memories, and more particularly to integrated circuit read/write memories.

BACKGROUND OF THE INVENTION

Integrated circuit static random access memories (SRAMs) are used in a variety of applications today. In particular, high speed SRAMs are used in such applications as caches for computer systems, work stations, and the like. These cache memories provide a high speed store of data or instructions that are likely to be reused. As integrated circuit technology has improved, microprocessors have correspondingly increased in speed and as microprocessor speed increases the access time of the SRAMs must decrease to provide efficient cache storage.

In general for high speed SRAMs, when data is read from the memory a memory cell located on an activated word line provides a signal to a complimentary pair of bit lines. The signal provided to the bit lines by the selected memory cell is a relatively weak signal which must be further amplified before being output by the memory. This signal may be in the form of a differential voltage signal or alternatively as a differential current signal. In the former case, which is known as the voltage sensing technique, a voltage sense amplifier will be required to convert the relatively weak voltage into a strong enough differential voltage for output. In the current sensing technique a differential current is provided by the memory cell to the bit lines. A current-to-voltage amplifier must recognize the relatively weak differential current signal and output a voltage differential signal of sufficient strength for subsequent output.

SRAMs also must be capable of performing a write cycle. During the write cycle data is received on integrated circuit pins and corresponding bit lines are driven with a differential signal which is relatively large in magnitude. This large differential signal is sufficient in strength to overwrite the data values stored in the selected memory cell. However, at the end of the write cycle in preparation for a succeeding read cycle, this large differential voltage must be reduced or eliminated.

There are two general techniques for accomplishing this write recovery. First, a transistor will couple a bit line to a complimentary bit line, which is known as equalization. Second, the bit lines may be biased to some predetermined voltage which is desirable for the type of sensing involved. For example, a typical precharge voltage will be the positive power supply voltage. However, note that other precharge potentials such as one-half the positive power supply voltage, or the positive power supply voltage minus a transistor threshold may be used. In order for the SRAM to be useful, the write recovery must be performed within a prescribed amount of time which is becoming smaller as memory access cycles are getting smaller.

A memory using the current sensing technique generally has a very good speed-power product. However, there are other problems using the current sensing technique. Write recovery speed is a problem unless large bit line loads are used. However it is desirable when using the current sensing technique to make the current through the bit line load to be as small as possible. Furthermore it is always desirable to minimize integrated circuit area. Thus what is needed is a memory which uses the current sensing technique but which also has fast write recovery with minimum size. Such a memory is provided by the present invention, whose features and advantages will be better understood with the attached drawings in conjunction with the following detailed description.

DESCRIPTION OF A PREFERRED EMBODIMENT

Figure 1:
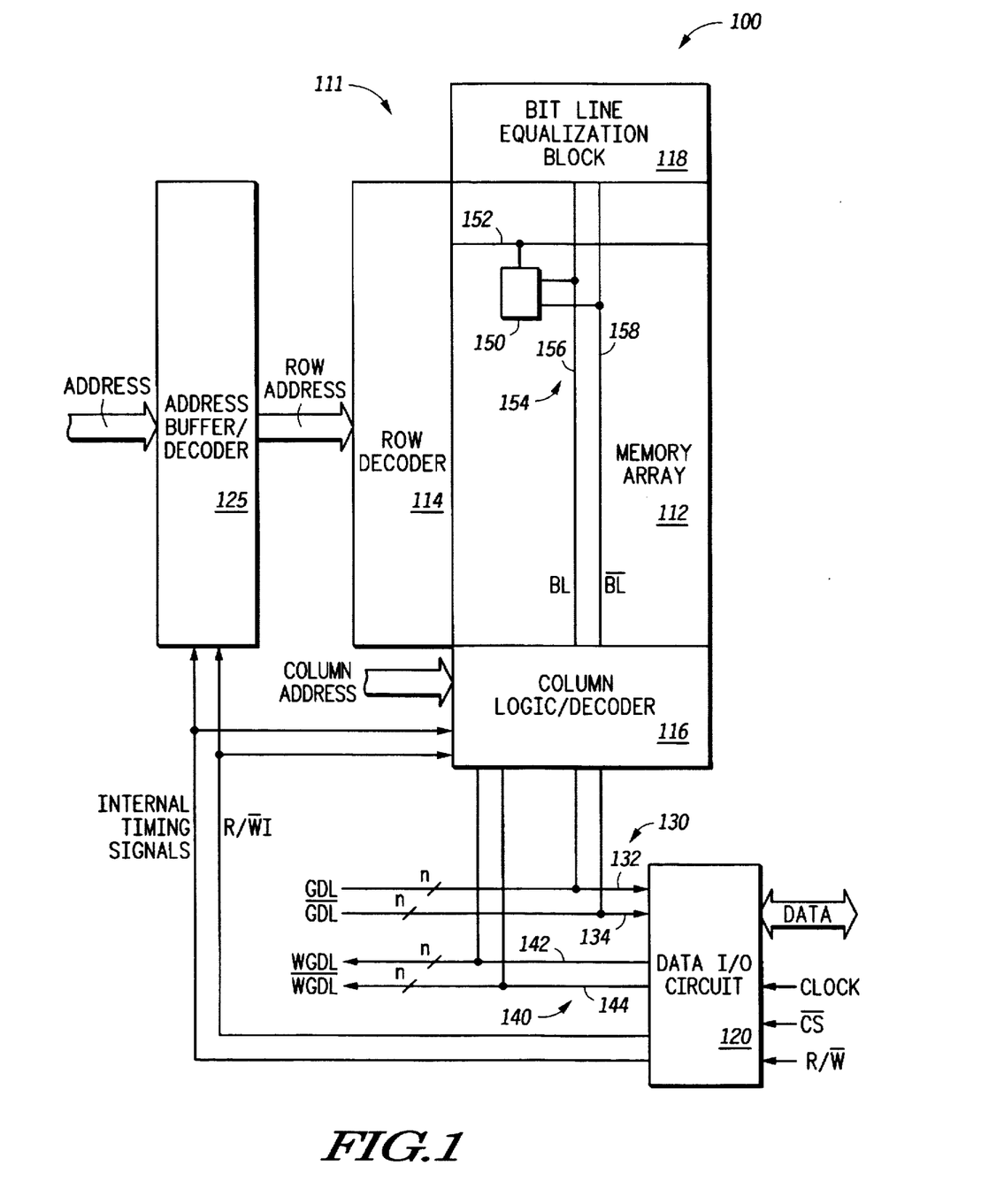
FIG. 1 illustrates in block form a memory in accordance with the present invention.

FIG. 1 illustrates in block form a memory 100 in accordance with the present invention. Memory 100 generally includes an address buffer/decoder 125, a memory array portion 111, a data I/O circuit 120, a read global data line bus 130, and a write global data line bus 140. Memory array portion 111 may be partitioned into array halves or quadrants, and may also include one or more blocks. Memory array portion 111 includes a memory array 112, a row decoder 114, a column logic/decoder 116, and a bit line equalization block 118. Memory array 112 includes an array of memory cells located at intersections of word lines and bit line pairs. Shown in FIG. 1 is a representative memory cell 150 located at an intersection of a word line 152 and a bit line pair 154. Bit line pair 154 includes a first bit line 156 conducting a signal labeled "BL", and a second bit line 158 conducting a signal labeled "$\overline{BL}$". Read global data line bus 130 includes n complementary pairs of global data lines, including a first global data line 132 labeled "GDL" and a second global data line 134 labeled "$\overline{GDL}$". Write global data line bus 140 also includes n complementary write global data lines including a first write global data line 142 and a second write global data line 144.

Address buffer/decoder 125 receives an input address labeled "ADDRESS". Address buffer/decoder 125 also receives a group of control signals labeled "INTERNAL TIMING SIGNALS", and a signal labeled "R/$\overline{W}$". Address buffer/decoder 125 receives and separates the ADDRESS into a row component labeled "ROW ADDRESS" and a column component labeled "COLUMN ADDRESS". Note that the address buffer/decoder 125 may perform partial or full decoding on the ADDRESS to obtain the ROW ADDRESS and the COLUMN ADDRESS.

In memory block 111, row decoder 114 receives the ROW ADDRESS, and activates a word line in response. Memory array 112 is connected to each of the word lines connected to the output of row decoder 114. Memory cells in memory array 112 are located at intersections of corresponding word lines and corresponding bit line pairs. Each bit line pair serves as an input to the memory cells during the write cycle of memory 100 and as an output during the read cycle. FIG. 1 illustrates a representative memory cell 150. Memory cell 150 is connected to word line 152 and to bit line pair 154. Bit line equalization block 118 represents bit line equalization transistors (shorting devices) which are connected to one end of each of the bit lines.

Column logic/decoder 116 receives the COLUMN ADDRESS, the INTERNAL CLOCKS, and the R/WI signal. Column logic/decoder 116 is connected to each bit line pair, including representative bit line pair 154, and is located at the end of the bit lines opposite to bit line equalization block 118. In the illustrated embodiment, column logic/decoder 116 also includes bit line loads. These bit line loads include both an equalization transistor and a precharge transistor for each bit line. By including a bit line equalization transistor at both ends of the bit lines, equalization and precharge is achieved faster for memories using relatively long bit lines. Column logic/decoder 116 is connected to read global data line bus 130 and write global data line bus 140. Each global data line bus includes n signal lines, where n may be any arbitrary number such as 1, 2, 4, 8, 16, 32, etc. depending on the size of memory 100.

Data I/O circuit 120 is connected to read global data line bus 130 and write global data line bus 140, and has a bidirectional terminal for conducting an n-bit signal labeled "DATA". Data I/O circuit 120 also has input terminals for receiving external control signals labeled "$\overline{CS}$", "R/$\overline{W}$", and "CLOCK", and output terminals for providing the INTERNAL TIMING SIGNALS and the R/WI signal. In the illustrated embodiment, memory 100 is a synchronous memory and generates the INTERNAL TIMING SIGNALS synchronously with the CLOCK signal. However, it will become apparent that the present invention is applicable to asynchronous memories as well. For an asynchronous memory, data I/O circuit 120 generates the INTERNAL CLOCK SIGNALS based on delays from the activation of the $\overline{CS}$ signal, and does not have a CLOCK input terminal.

In basic operation, address buffer/decoder 125 receives the ADDRESS during a read cycle or a write cycle of memory 100. In the read cycle, signal $\overline{CS}$ is activated and R/$\overline{W}$ is a logic high; during the write cycle, signal $\overline{CS}$ is activated and signal R/$\overline{W}$ is a logic low. Signals R/$\overline{W}$ is buffered from input signals R/$\overline{W}$ and is substantially the same signal. Row decoder 114 enables one word line in response to receiving the ROW ADDRESS. During the read cycle, each memory cell which is connected to an enabled word line is selected and couples its output as a differential current on a bit line pair to which it is coupled. For example, when the ROW ADDRESS enables word line 152, memory cell 150 is selected and provides a differential current to bit line pair 154 representative of the state of the bit stored therein. All bit line pairs are driven during the read cycle by memory cells connected to the enabled word line. The signals on all bit line pairs are differential currents.

Column logic/decoder 116 selects n bit line pairs based on the COLUMN ADDRESS. The INTERNAL TIMING SIGNALS provide information to column logic/decoder 116 that an operation has begun, and R/$\overline{W}$ determines whether a read cycle or a write cycle is in progress. After selecting the bit line pair or pairs based on the column address, column logic/decoder 116 connects each of the selected bit line pairs to a corresponding global data line pair and amplifies a signal thereon using differential current sensing techniques. In response to $\overline{CS}$ and R/$\overline{W}$ indicating a read cycle, data I/O circuit 120 receives a differential signal on each read global data line pair, converts it to a single ended signal, and outputs DATA.

During the write cycle, the flow of data is essentially reversed. A write cycle is signified by signal $\overline{CS}$ becoming active and R/$\overline{W}$ being a logic low. Data I/O circuit 120 receives DATA as an input, and drives each DATA signal as a differential signal on a corresponding write global data line pair. For example, write global data line bus 140 is representative of each selected write global data line pair in memory 100. Write global data line bus 140 is driven by data I/O circuit 120 based on the received DATA. In response to the INTERNAL TIMING SIGNALS, R/WI, and the COLUMN ADDRESS, column logic/decoder 116 couples each write global data line pair to a selected bit line pair. Row decoder 114 enables a word line and the input data is driven into memory cells located at intersections of enabled word lines and selected bit line pairs. As in the read cycle, memory cells located on an enabled word line have outputs coupled to bit line pairs. However a voltage differential driven on bit line pairs by column logic/decoder 116 is greater than the drive voltage of the memory cell and overwrites a stored bit in the memory cell.

At the end of the write cycle, known as the write recovery period, equalization of the bit line pairs is achieved in part by equalization on the bit line, both by bit line equalization block 118 and the corresponding bit line loads in column logic/decoder 116, and in part indirectly by equalization on read data lines which are between the bit lines and the global read data lines. In order to achieve this equalization, the circuitry which connects the read data lines to the bit lines becomes active at the end of the write cycle. This write recovery system is especially advantageous when memory 100 uses current sensing, which will be explained further with reference to FIG. 2.

Figure 2:
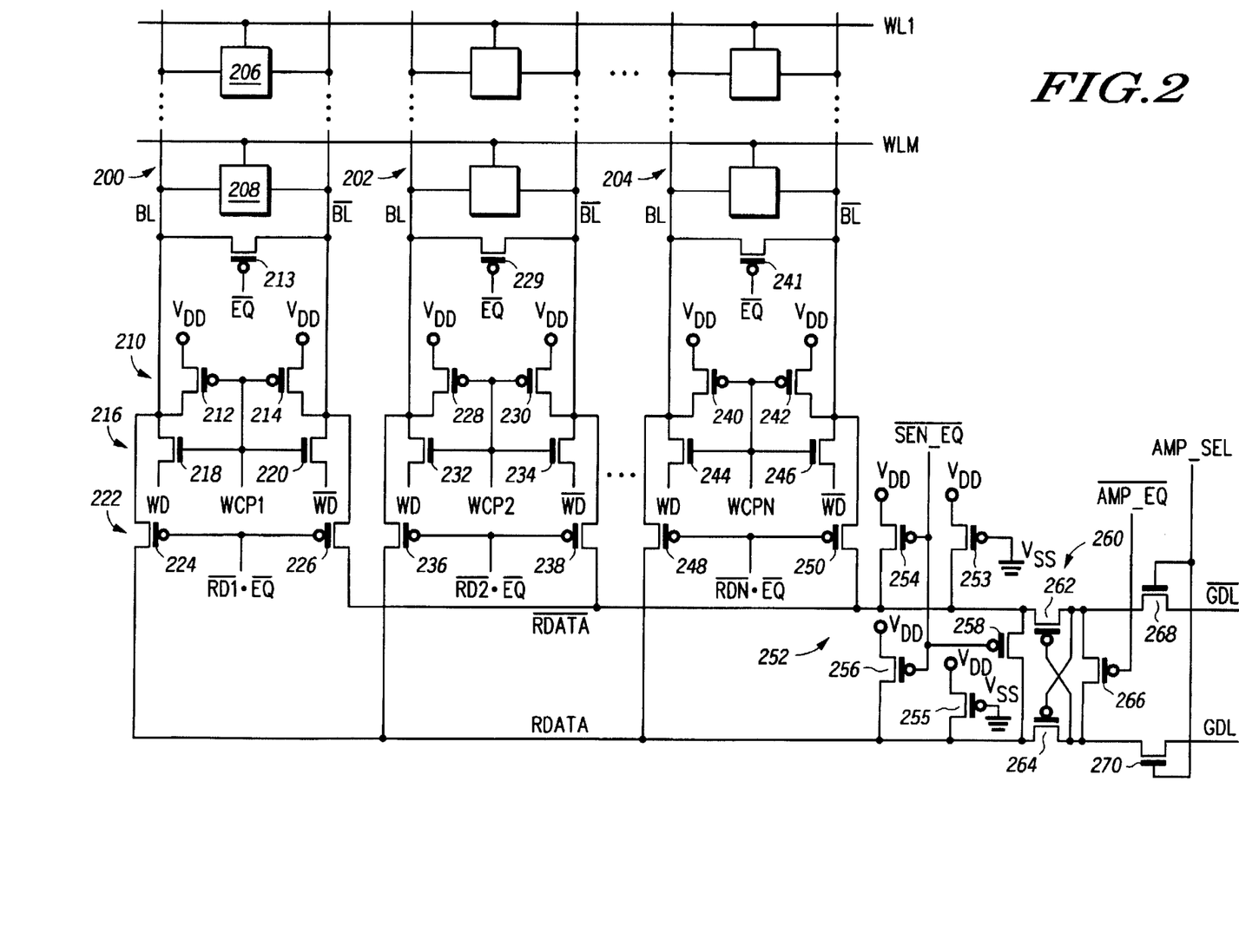
FIG. 2 is a combination block diagram and circuit diagram of a portion of the memory of FIG. 1.

FIG. 2 is a combination block diagram and circuit diagram of a portion of memory 100 of FIG. 1. Illustrated in FIG. 2 are n columns of which three are shown along with corresponding data line equalization portions and sense amplifiers. The number of columns connected to a single sense amplifier may vary from application to application. For example, in the illustrated embodiment there are four columns connected to a single pair of data lines. However, other values may be used as well.

Illustrated in FIG. 2 are portions of memory array 112 and column logic/decoder 116 of FIG. 1. The portion of memory array 112 illustrated in FIG. 2 includes a first column 200, second column 202, and a third column 204. Column 200 includes a pair of complimentary bit lines labeled BL and $\overline{BL}$, as well as representative memory cells 206 and 208. Memory cell 206 has an input terminal connected to a first word line labeled "WL1", and has complimentary outputs coupled to BL and $\overline{BL}$. Memory cell 208 has an input connected to an $m^{th}$ word line labeled "WLM", and two output terminals connected to BL and $\overline{BL}$. The number of memory cells is illustrated as being an arbitrary number m to help illustrate that the present invention is not limited to any particular array size. Likewise, columns 202 and 204 both include m memory cells connected to a corresponding word line and providing outputs to a corresponding bit line pair. The structure of these columns is identical to column 200 they will not be discussed further.

The remainder of FIG. 2 illustrates portions of column logic/decoder 116. For example, a first bit line load 210 is connected to column 200 and includes P-channel insulated gate field effect transistors 212–214, also commonly referred to as metal-oxide-semiconductor (MOS) transistors. Transistor 212 has a source connected to a power supply voltage labeled "$V_{DD}$", a gate for receiving a signal labeled "WCP1", and a drain coupled to BL. $V_{DD}$ is a more positive power supply voltage having a nominal value of approximately 3 volts, but may vary from embodiment to embodiment. Transistor 213 has a first current electrode connected to BL, a gate for receiving a control signal labelled "$\overline{EQ}$", and a second current electrode connected to a complement bit line labelled "$\overline{BL}$". Transistor 214 has a source connected to $V_{DD}$, a gate for receiving signal WCP1, and a drain connected to $\overline{BL}$.

In forming a write path a pair of drive transistors 216 connect two write data lines labeled "WD" and "$\overline{WD}$", respectively to corresponding bit lines BL and $\overline{BL}$. Pair 216 includes a first N-channel transistor 218, and a second N-channel transistor 220. Transistor 218 has a first current electrode connected to BL, a gate for receiving signal WCP1 and a second current electrode connected to WD. Transistor 220 has a first current electrode connected to $\overline{BL}$, a gate for receiving signal WCP1, and a second current electrode for connected to $\overline{WD}$. Note that the source and drain designations of transistors 218 and 220 will vary according to the voltages applied and thus they are designated generically.

The read path includes a pair of drive transistors 222. Pair 222 includes a first P-channel transistor 224, and a second P-channel transistor 226. Transistor 224 has a first current electrode connected to BL, a gate for receiving a signal labeled "RD1•$\overline{EQ}$", and a second current electrode for providing a signal to a read data line labeled "RDATA", wherein the "•" symbol represents a logical AND operation. Transistor 226 has a first current electrode connected to $\overline{BL}$, a gate for receiving signal RD1•$\overline{EQ}$, and a second current electrode for providing an output signal to a compliment of the data line labeled "$\overline{RDATA}$". Corresponding to column 202 are similar bit line load transistors 228–230, write drive transistors 232 and 234, and read drive transistors 236 and 238. The bit line load pullup transistors are selected by a signal labeled "WCP2", and the equalization transistor is selected by signal $\overline{EQ}$. Write drive transistors 232 and 234 are selected by a signal labeled "RD2•$\overline{EQ}$". Finally n$^{th}$ column 204 includes bit line load transistors 240–242, a pair of write drive transistors 244 and 246, and a pair of read drive transistors 248 and 250 corresponding to those previously described. Transistors 240, 242, 244, and 246 receive a signal labeled "WCPN", transistor 241 receives signal $\overline{EQ}$, and transistors 248 and 250 receive a signal labeled "RDN•$\overline{EQ}$".

Connected to the read data line pair is a data line load 252. Data line load 252 includes P-channel transistors 253–257. Transistor 253 has a source connected to $V_{DD}$, a gate connected to a power supply voltage terminal labeled "$V_{SS}$", and a drain connected to $\overline{RDATA}$. $V_{SS}$ is a more negative or ground power supply voltage terminal having a nominal value of approximately zero volts. Transistor 254 has a source connected to $V_{DD}$, a gate for receiving a signal labeled "$\overline{SEN_{13}EQ}$", and a drain connected to $\overline{RDATA}$. Transistor 255 has a source connected to $V_{DD}$, a gate connected to $V_{SS}$, and a drain connected to RDATA. Transistor 256 has a source connected to $V_{DD}$, a gate for receiving signal $\overline{SEN\_EQ}$, and a drain connected to RDATA. Transistor 258 has a first current electrode connected to $\overline{RDATA}$, a gate for receiving signal $\overline{SEN\_EQ}$, and a drain connected to RDATA.

Also connected to the data lines is a current conveyor circuit 260. Circuit 260 includes a P-channel transistor 262, a P-channel transistor 264, a P-channel transistor 266, an N-channel transistor 268, and an N-channel transistor 270. Transistor 262 has a first current electrode connected to RDATA, a gate, and a second current electrode. Transistor 264 has a first current electrode connected to RDATA, a gate connected to the second current electrode of transistor 262, and a second current electrode connected to the gate of transistor 262. Transistor 266 has a first current electrode connected to the second current electrode of transistor 262, a gate for receiving a signal labeled "AMP_EQ", and a second current electrode connected to the second current electrode of transistor 264. Transistor 268 has a first current electrode connected to the second current electrode of transistor 262, a gate for receiving a signal labeled "$\overline{AMP\_SEL}$", and a second current electrode connected to GDL. Transistor 270 has a first current electrode connected to the second current electrode of transistor 264, a gate for receiving signal $\overline{AMP\_SEL}$, and a second current electrode connected to GDL.

In operation, when the memory is accessed row decoder 114 of FIG. 1 activates a word line such as WL1 or WLM or any other word line in the array. Activating one word line selects one memory cell from each column. The selected memory cell provides a current signal to the corresponding BL and $\overline{BL}$ signal lines representative of the memory state stored therein. Of the n columns of transistors shown in FIG. 2 only a single one is selected. And thus, only a single one of $\overline{RD1\_EQ}$, $\overline{RD2\_EQ}$, or in general $\overline{RDN\_EQ}$ is active to select corresponding drive transistors. When these corresponding drive transistors are selected, a differential current is driven on to RDATA and $\overline{RDATA}$ representative of the state of the memory cell in the selected column. The small differential current between RDATA and $\overline{RDATA}$ is transported onto GDL and $\overline{GDL}$ through current conveyor circuit 260. The sensing function is completed in data I/O circuit 120 of FIG. 1, which will be described in further detail with respect to FIG. 4 below.

During a write cycle, write data is received on a corresponding WD/$\overline{WD}$ pair and is driven onto the bit lines when the corresponding write select signal such as signal WCP1 is activated. Unlike the relatively weak read current signal, the write voltage signal is very strong and logic levels may be very close to the power supply voltages. This differential voltage is very adequate to overwrite the contents of the selected memory cell.

At the end of the write cycle, however, this large voltage remains on the bit lines and must be reduced for subsequent sensing purposes. This reduction is accomplished by two mechanisms. The first mechanism is the bit line load. Assuming column 200 is the selected column, transistors 212 and 214 become active to connect BL and $\overline{BL}$ to $V_{DD}$. In addition, transistor 213 becomes conductive to couple BL to $\overline{BL}$. This function is referred to generally as equalization, but these actions together form the first mechanism of write recovery.

The second mechanism is provided by data line load 252 which additionally couples BL and $\overline{BL}$ in a selected column to $V_{DD}$ through transistors 253 through 256. Transistors 253 and 255 are relatively weak devices which are continuously conductive, whereas transistors 254 and 256 are switched during the beginning of the read cycle and during write recovery. Because the transistors in data line load 252 are connected to data lines which each connect to n columns, they may be made larger without increasing the pitch of the column and thus will not impact memory area in the same way as if they were located in the corresponding bit line load.

In addition, note that data line load 252 is placed on read data lines at a point after which they are isolated from the write data lines. In memory 100, the write path proceeds through N-channel transistors 218 and 220 and a selected write data line is pulled to a low voltage while the other one remains precharged to $V_{DD}$. Thus, it is important for an N-channel transistor to be used to avoid a threshold voltage drop. However, at the same time it is important to include these write drive transistors without increasing the pitch of the memory cells. If transistors 218 and 220 were converted into full complementary metal-oxide-semiconductor (CMOS) transmission gates, the pitch of the cells would have to be increased. Thus, placing the loads which work in conjunction with the bit line loads on the read data lines has the advantage that memory cell pitch is not increased.

An additional feature which assists equalization of bit lines during write recovery is also shown in FIG. 2. During the equalization period a selected column is connected to data line load 252 through corresponding read drive transistors. However, during write recovery other columns are also connected to the read data lines so that all columns selectively connected to RDATA and $\overline{RDATA}$ (and other columns which are connected to other corresponding data lines) are connected thereto during write recovery. Making these connections has two advantages. First, it simplifies the decoding of the control signals. Second, the stored charge on each of the nonselected bit lines assists in quickly precharging bit lines along the selected column after the write cycle. Note that in other embodiments it may not be necessary to connect unselected columns to RDATA and $\overline{RDATA}$ if the additional charging and recovery advantage is not needed. In addition note that in other embodiments data line load 252 may be omitted and all columns connected to RDATA and $\overline{RDATA}$ are connected together during write recovery to assist the bit lines loads in the selected column in recharging the bit lines to $V_{DD}$. This would allow the bit line load pull up transistors to be made smaller or speed write recovery for a given transistor size.

Figure 3:
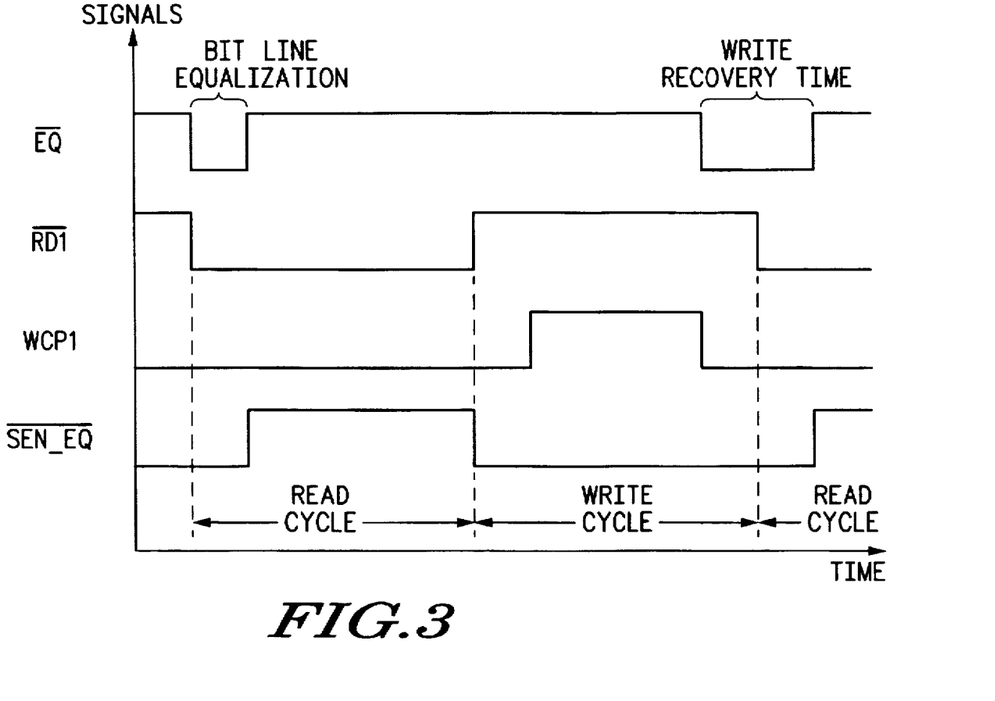
FIG. 3 shows a timing diagram useful in understanding the operation of the portion of the memory of FIG. 2.

FIG. 3 illustrates a timing diagram of signals useful in understanding the operation of FIG. 2. In FIG. 3 the horizontal axis represents time and the vertical axis represents the voltage of various signals, including $\overline{EQ}$, $\overline{RD1}$, WCP1, and $\overline{SEN\_EQ}$. These signals are illustrated for three time periods of interest including a read cycle, a write cycle, and a subsequent read cycle. During the early portion of the read cycle, signal $\overline{RD1}$ is active at a logic low to select the corresponding column. And during this period signal $\overline{EQ}$ is also low which effects the equalization of the bit lines. Signal WCP1 remains low or inactive throughout the read cycle. A certain period of time after signal $\overline{RD1}$ is activated, $\overline{SEN\_EQ}$ is active at a logic low near the beginning of the cycle to precharge the read data lines. Signal $\overline{SEN\_EQ}$ becomes inactive in order that a differential signal may be sent, and remains inactive during the remainder of the read cycle.

A write cycle is indicated by signal $\overline{RD1}$ being inactive and signal WCP1 becoming active. During the write cycle, signal $\overline{SEN\_EQ}$ remains active such that the precharge transistors in data line load 252 remain conductive. During this period of time signal $\overline{EQ}$ is inactive to allow the write data to separate the bit lines selected thereby and overwrite the selected memory cell. At the end of the write cycle signal WCP1 again becomes inactive and write recovery begins before the end of the write cycle with the activation of signal $\overline{EQ}$ and the inactivation of signal WCP1. A delay time after WCP1 becomes inactive, signal $\overline{RD1}$ becomes active which connects the data lines to the bit lines of the selected column.

In addition, during write recovery all other $\overline{RD}$ signals also become active. The write cycle ends when signal $\overline{RD1}$ becomes active.

Note that the read drive transistors are conductive if either signal $\overline{EQ}$ is active at a logic low, or signal $\overline{RD}$ is active at a logic low, since these signals are ANDed together. Thus, during the write recovery time all read drive transistors are conductive to couple the bit lines of all columns to RDATA and $\overline{RDATA}$ and after a certain amount of time the write recovery period ends and a subsequent read cycle begins. Note that FIG. 3 illustrates a read cycle following a write cycle. If an idle cycle follows a write cycle, signal $\overline{EQ}$ will remain active for the duration of the write cycle such that equalization is continuously performed until another cycle begins.

Figure 4:
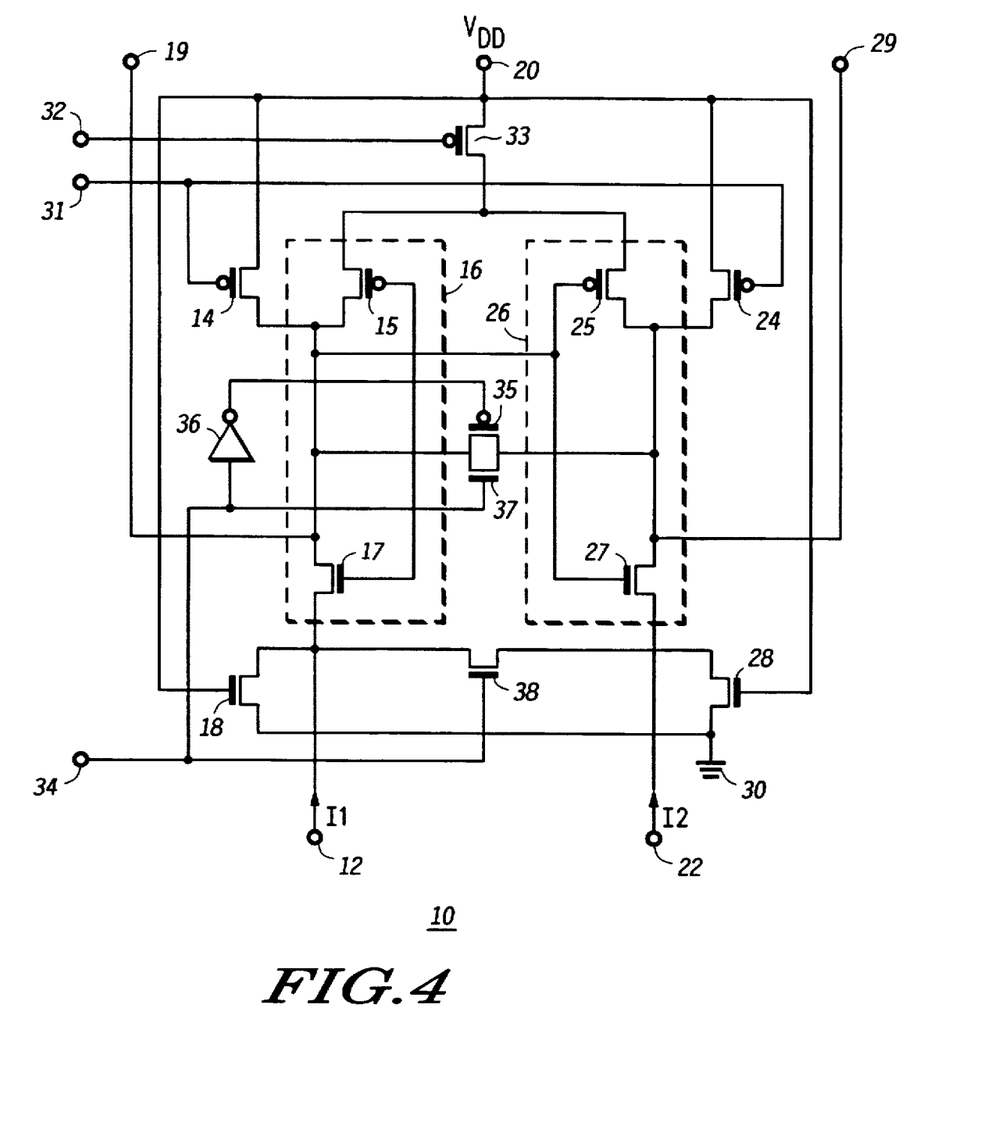
FIG. 4 shows a schematic diagram of a current sensing circuit which may be used in the memory of FIG. 1.

FIG. 4 is a schematic diagram of a current sensing circuit 10 which may be connected to the read global data lines to complete the current sensing function. Current sensing circuit 10 is a part of data I/O circuit 120 of FIG. 1. Current sensing circuit 10 senses the difference between currents $I_1$ and $I_2$ flowing into current sensing circuit 10 through an input terminal 12 and a complementary input terminal 22, respectively. The difference between currents $I_1$ and $I_2$ is used for sensing the data transmitted to current sensing circuit 10. Input terminal 12 and complementary input terminal 22 are coupled to GDL and $\overline{GDL}$, respectively. Current sensing circuit 10 is also referred to as a sense amplifier.

Sense amplifier 10 includes P-channel insulated gate field effect transistors (FETs) 14 and 24 which serve as current sources. The gate electrodes of FETs 14 and 24 are connected to a terminal 31 for receiving a first enabling signal. The source electrodes of FETs 14 and 24 are connected to a voltage supply conductor 20. By way of example, conductor 20 is at a voltage level of $V_{DD}$. In other words, the source electrodes of FETs 14 and 24 are connected to the voltage level $V_{DD}$. Sense amplifier 10 also includes a P-channel insulated gate FET 33 having a gate electrode connected to a terminal 32 for receiving a second enabling signal and a source electrode connected to the voltage level $V_{DD}$ at conductor 20.

Sense amplifier 10 further includes an inverter 16, an N-channel insulated gate FET 18, an inverter 26, and an N-channel insulated gate FET 28. Inverter 16 is comprised of a P-channel insulated gate FET 15 and an N-channel insulated gate FET 17. The gate electrodes of FETs 15 and 17 are commonly connected to form an input of inverter 16. A source electrode of FET 15 serves as a first biasing node of inverter 16 and is connected to a drain electrode of FET 33. A source electrode of FET 17 serves as a second biasing node of inverter 16 and is connected to a drain electrode of FET 18 and to input terminal 12. The drain electrodes of FETs 15 and 17 are commonly connected to form an output of inverter 16. The output of inverter 16 is connected to a drain electrode of FET 14 and to a data output terminal 19 of sense amplifier 10.

Inverter 26 is comprised of a P-channel insulated gate FET 25 and an N-channel insulated gate FET 27. The gate electrodes of FETs 25 and 27 are commonly connected to form an input of inverter 26. A source electrode of FET 25 serves as a first biasing node of inverter 26 and is connected to the drain electrode of FET 33. A source electrode of FET 27 serves as a second biasing node of inverter 26 and is connected to a drain electrode of FET 28 and to complementary input terminal 22. The drain electrodes of FETs 25 and 27 are commonly connected to form an output of inverter 26. The output of inverter 26 is connected to a drain electrode of FET 24 and to a complementary data output terminal 29 of sense amplifier 10.

Further, the input of inverter 16 is connected to the output of inverter 26, and the input of inverter 26 is connected to the output of inverter 16. The gate electrodes of FETs 18 and 28 are connected to the voltage level $V_{DD}$ at conductor 20. The source electrodes of FETs 18 and 28 are connected to a voltage supply conductor 30. By way of example, voltage supply conductor 30 is at a ground voltage level, i.e., $V_{SS}$.

Sense amplifier 10 further includes an inverter 36 and two switches, one coupled between the outputs of inverters 16 and 26, and the other coupled between the second biasing nodes of inverters 16 and 26. Preferably, the switch coupled between the outputs of inverters 16 and 26 is a two transistor pass gate comprised of a P-channel insulated gate FET 35 and an N-channel insulated gate FET 37. An input of inverter 36 is connected to a terminal 34 for receiving an equalization signal. An output of inverter 36 is connected to a gate electrode of FET 35. A gate electrode of FET 37 is connected to terminal 34. The source electrodes of FETs 35 and 37 are commonly connected to the drain electrodes of FETs 15 and 17. The drain electrodes of FETs 35 and 37 are commonly connected to the drain electrodes of FETs 25 and 27.

Preferably, the switch coupled between the second biasing nodes of inverters 16 and 26 is a one transistor pass gate comprised of an N-channel insulated gate FET 38. A gate electrode of FET 38 is connected to terminal 34, a source electrode of FET 38 is connected to the source electrode of FET 17, and a drain electrode of FET 38 is connected to the source electrode of FET 27.

As described in more detail hereinafter with reference to FIG. 5, sense amplifier 10 senses data by sensing a differential current signal transmitted to input terminal 12 and complementary input terminal 22. More particularly, sense amplifier 10 senses currents $I_1$ and $I_2$ flowing through input terminal 12 and complementary input terminal 22, respectively. Currents $I_1$ and $I_2$ are also referred to as first and second current components of the differential current signal. Sense amplifier 10 generates two currents, one flowing in FET 17 and the other flowing in FET 27, in accordance with currents $I_1$ and $I_2$. Sense amplifier 10 then compares the current flowing in FET 17 with the current flowing in FET 27 to sense the data.

It should be noted that FETs 14, 15, 17, 18, 24, 25, 27, 28, 33, 35, 37, and 38 are not limited to being insulated gate FETs as shown in FIG. 4. They can be replaced with other kinds of transistors such as, for example, bipolar transistors, metal semiconductor FETs, junction FETs, insulated gate bipolar transistors, etc. Further, FET 33 functions as a switch and can be replaced by any kind of switch. As those skilled in the art are aware, for a FET, the gate electrode serves as a control electrode, and the source and drain electrodes serve as current conducting electrodes.

In sense amplifier 10, FETs 14 and 24 function as current sources, and FETs 18 and 28 function as current sinks. They can be replaced by other kinds of current source/sink circuits. Preferably, FETs 14 and 18 have substantially the same current carrying capabilities as FETs 24 and 28, respectively.

In inverter 16, FET 15 functions as a pull-up transistor and FET 17 functions as a pull-down transistor, and therefore, FETs 15 and 17 are preferably of different conductivity types. Likewise in inverter 26, FET 25 functions as a pull-up transistor and FET 27 functions as a pull-down transistor, and therefore, FETs 25 and 27 are preferably of different conductivity types. In the embodiment shown in FIG. 4, FETs 15 and 25 are P-channel FETs and FETs 17 and 27 are N-channel FETs. In an alternative embodiment, FETs 15 and 25 are replaced by PNP bipolar transistors and FETs 17 and 27 are replaced by NPN bipolar transistors.

FET 38 functions as a pass gate and can be replaced by a different type of pass gate, e.g., a two transistor pass gate. FETs 35 and 37 form a two transistor pass gate and can be replaced by a different type of pass gate. The two pass gates provide sense amplifier 10 with the capability of performing high speed back-to-back sensing operations. It should be noted that both pass gates are optional in sense amplifier 10. Because of the large voltage swing, e.g., from ground voltage level to $V_{DD}$, across output terminal 19 and complementary output terminal 29, the pass gate coupled therebetween is preferably a two transistor pass gate as shown in FIG. 4. However, this is not intended as a limitation of the present invention. If a one transistor pass gate is used in place of FETs 35 and 37, the equalization signal applied to its control electrode is preferably adjusted to provide it with bi-directional conduction capability during the operation of sense amplifier 10.

Figure 5:
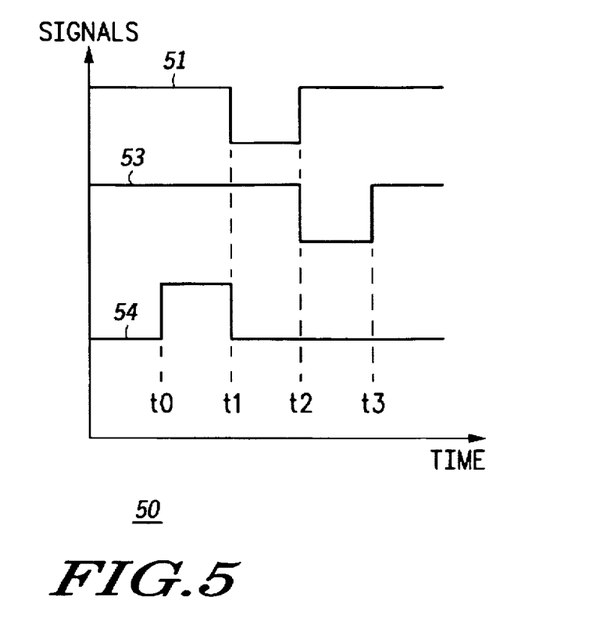
FIG. 5 is a timing diagram of signals applied to the current sensing circuit of FIG. 4 during a data sensing process.

FIG. 5 is a timing diagram 50 of signals applied to a current sensing circuit during a data sensing process in accordance with the present invention. Timing diagram 50 includes a first enabling signal 51, a second enabling signal 52, and an equalization signal 54. When using sense amplifier 10 of FIG. 4 to sense data, first enabling signal 51, second enabling signal 52, and equalization signal 54 are applied to terminals 31, 32, and 34, respectively. Input terminal 12 and complementary input terminal 22 are coupled to a memory cell via bit lines, read data lines, and global data lines. In another example, input terminal 12 and complementary input terminal 22 are coupled to two memory cells (not shown) via a multiplexer (not shown). One memory cell is referred to as a primary memory cell and the other memory cell is referred to as a redundant memory cell. The multiplexer selects the primary memory cell in normal operation and selects the redundant memory cell if the primary memory cell is defective.

When sense amplifier 10 is idle, first enabling signal 51 and second enabling signal 52 are preferably at a high voltage level such as, for example, supply voltage $V_{DD}$, and equalization signal 54 is preferably at a low voltage level such as, for example, ground voltage level. Therefore, FETs 14, 24, 33, 35, 37, 38 are nonconductive, inverters 16 and 26 are disabled, and sense amplifier 10 does not consume significant power.

Before the sensing process starts, equalization signal 54 is switched to a high voltage level, such as $V_{DD}$, at a time $t_0$. The high voltage level is transmitted to the gate electrodes of FETs 37 and 38 and switches FETs 37 and 38 on. The high voltage level is also transmitted to the input of inverter 36, which generates a low voltage level at the gate electrode of FET 35 and switches FET 35 on. Conductive FETs 35 and 37 substantially equalize the potentials at output terminal 19 and complementary output terminal 29. Likewise, conductive FET 38 substantially equalizes the potentials at input terminal 12 and complementary input terminal 22.

The sensing process starts at a time $t_1$ when equalization signal 54 is switched back to the low voltage level and first enabling signal 51 is switched to a low voltage level, such as ground voltage level. FETs 35, 37, and 38 are switched off, thereby isolating output terminal 19 from complementary output terminal 29 and isolating input terminal 12 from complementary input terminal 22. FETs 14 and 24 are switched on. Two current paths are established between $V_{DD}$ and ground, one through FETs 14, 17, and 18, and the other through FETs 24, 27, and 28. It should be noted that, although FIG. 2 shows the falling edge of first enabling signal 51 coinciding with the falling edge of equalization signal 54, this is not intended as a limitation of the present invention.

The data stored in the memory cell is encoded in currents $I_1$ and $I_2$ and transmitted to sense amplifier 10 via input terminal 12 and complementary input terminal 22. Current $I_1$, flows from the memory cell to conductor 30 via input terminal 12 and FET 18. Thus, the current flowing in FET 18 is equal to the sum of current $I_1$ and the current flowing in FETs 14 and 17. Likewise, current $I_2$ flows from the memory cell to conductor 30 via complementary input terminal 22 and FET 28. Thus, the current flowing in FET 28 is equal to the sum of current $I_2$ and the current flowing in FETs 24 and 27. Because FETs 18 and 28 are designed to have substantially the same current carrying capability, the current flowing in FET 18 is substantially equal to the current flowing in FET 28. This current is referred to as a reference current. Therefore, the current flowing in FETs 14 and 17 is substantially equal to the reference current minus current $I_1$. Similarly, the current flowing in FETs 24 and 27 is substantially equal to the reference current minus current $I_2$. Sense amplifier 10 senses the data by comparing the current flowing in FETs 14 and 17 with the current flowing in FETs 24 and 27.

If the memory cell stores a first logic value, e.g., a logic "1", current $I_1$ is slightly greater than current $I_2$. Typically, the difference between currents $I_1$ and $I_2$ ranges between approximately 40 micro-amperes ($\mu$A) and approximately 80 $\mu$A. A nominal value for the current difference is approximately 60 $\mu$A. The current flowing in FETs 14 and 17 is less than the current flowing in FETs 24 and 27 by substantially the same amount that current $I_1$ is greater than current $I_2$. The smaller current flowing in FET 14 than that flowing in FET 24 develops a smaller voltage drop across the drain and source electrodes of FET 14 than that across the drain and source electrodes of FET 24. Consequently, the voltage level at the drain electrodes of FETs 15 and 17 is slightly higher than the voltage level at the drain electrodes of FETs 25 and 27.

On the other hand, if the memory cell stores a second logic value, e.g., a logic "0", which is complementary to the first logic value, current $I_1$ is slightly less than current $I_2$. The current flowing in FETs 14 and 17 is greater than the current flowing in FETs 24 and 27 by substantially the same amount that current $I_1$ is less than current I. The larger current flowing in FET 14 than that flowing in FET 24 develops a larger voltage drop across the drain and source electrodes of FET 14 than that across the drain and source electrodes of FET 24. Consequently, the voltage level at the drain electrodes of FETs 15 and 17 is slightly lower than the voltage level at the drain electrodes of FETs 25 and 27.

At a time $t_2$, first enabling signal 51 is switched back to the high voltage level and second enabling signal 52 is switched to a low voltage level, such as ground voltage level. FETs 14 and 24 are switched off, FET 33 is switched on, and inverters 16 and 26 are enabled. In response to the voltage across the drain electrodes of FETs 17 and 27, inverters 16 and 26 form a latch circuit which generates a differential voltage signal across output terminal 19 and complementary output terminal 29.

When the memory cell stores a logic "1", the voltage level at the drain electrodes of FETs 15 and 17 is slightly higher than the voltage level at the drain electrodes of FETs 25 and 27. The higher voltage level at the drain electrodes of FETs 15 and 17 is transmitted to the gate electrodes of FETs 25 and 27, turning off FET 25 and turning on FET 27. Likewise, the lower voltage level at the drain electrodes of FETs 25 and 27 is transmitted to the gate electrodes of FETs 15 and 17, turning on FET 15 and turning off FET 17. With FET 15 conductive and FET 17 nonconductive, inverter 16 pulls the voltage level at output terminal 19 up to $V_{DD}$. With FET 25 nonconductive and FET 27 conductive, inverter 26 pulls the voltage level at complementary output terminal 29 down to ground. Thus, a logic "1" is read from the memory cell.

When the memory cell stores a logic "0", the voltage level at the drain electrodes of FETs 15 and 17 is slightly lower than the voltage level at the drain electrodes of FETs 25 and 27. The lower voltage level at the drain electrodes of FETs 15 and 17 is transmitted to the gate electrodes of FETs 25 and 27, turning on FET 25 and turning off FET 27. Likewise, the higher voltage level at the drain electrodes of FETs 25 and 27 is transmitted to the gate electrodes of FETs 15 and 17, turning off FET 15 and turning on FET 17. With FET 15 nonconductive and FET 17 conductive, inverter 16 pulls the voltage level at output terminal 19 down to ground. With FET 25 conductive and FET 27 nonconductive, inverter 26 pulls the voltage level at complementary output terminal 29 UP to $V_{DD}$. Thus, a logic "0" is read from the memory cell.

The sensing process ends at a time $t_3$ when second enabling signal 52 is switched back to the high voltage level. The high voltage level at terminal 32 switches off FET 33, thereby disabling inverters 16 and 26. Sense amplifier 10 enters an idle state and is ready for the next data sensing process.

During the data sensing process, FETs 18 and 28 remain conductive. Therefore, the voltage levels at input terminal 12 and complementary input terminal 22 remain close to ground voltage level. In other words, the voltage swing across the global data line coupled to input terminal 12 and the complementary global data line coupled complementary input terminal 22 is small, e.g., less than approximately 20 milli-volts (mV).

Because of the small voltage swing, sense amplifier 10 is suitable for high speed and long bit line applications. Further, sense amplifier 10 does not include a high gain differential voltage amplifier that drains a large current. Therefore, sense amplifier 10 is power efficient compared with prior art sense amplifiers. When sense amplifier 10 generates its output, the voltage levels at output terminal 19 and complementary output terminal 29 are either pulled up to $V_{DD}$ or pulled down to ground. Therefore, sense amplifier 10 and the sensing process are compatible with standard CMOS logic levels.

While the invention has been described in the context of a preferred embodiment, it will be apparent to those skilled in the art that the present invention may be modified in numerous ways and may assume many embodiments other than that specifically set out and described above. For example, the write recovery technique disclosed herein may be used with many types of memory cells, including SRAM, dynamic random access memory (DRAM), nonvolatile memory, and the like. Also note that in other embodiments the switched bit line load pullup transistors may be replaced by continuously-conductive devices, such as P-channel transistors with grounded gates. This substitution will incur a performance penalty in terms of both speed and power. While switched pullup transistors are preferred, the performance penalty may be tolerable in some applications. Accordingly, it is intended by the appended claims to cover all modifications of the invention which fall within the true spirit and scope of the invention.

We claim:

1. A memory device, comprising:
   a plurality of memory cells, each memory cell of the plurality of memory cells coupled to a word line and to a bit line pair;
   a bit line load, coupled to the bit line pair, for charging the bit line pair to a predetermined voltage in response to a first control signal;
   a read data line pair for selectively coupling the bit line pair to output circuitry during a read cycle of the memory device; and
   a precharge circuit, coupled to the read data line pair, and responsive to a second control signal, wherein following an access to a memory cell coupled to the bit line pair, the read data line pair is coupled to the bit line pair, and the first and second control signals are asserted at about the same time to recharge the bit line pair to the predetermined voltage.

2. The memory device of claim 1, wherein the precharge circuit further comprises an equalization circuit.

3. The memory device of claim 1, wherein the memory device is characterized as being a static random access memory.

4. The memory device of claim 1, further comprising a write data line pair selectively coupled to the bit line pair, wherein the write data line pair is decoupled from the bit line pair in response to the first control signal.

5. The memory device of claim 1, wherein the predetermined voltage is equal to a power supply voltage.

6. The memory device of claim 1, wherein a predetermined number of bit line pairs are selectively coupled to the read data line pair, and each of the predetermined number of bit line pairs are coupled to the read data line pair following the access for assisting a recharge of the bit line pair coupled to the accessed memory cell.

7. The memory device of claim 1, further comprising a current conveying sense amplifier, coupled to the read data line pair, for sensing a current in the read data line pair.

8. The memory device of claim 7, further comprising a data line load, coupled to the read data line pair, for providing a source for the current in the read data line pair.

9. A memory device, comprising:
   a memory cell array having a plurality of memory cells coupled to bit line pairs;
   a plurality of bit line loads, a bit line load coupled to each of the bit line pairs, for recharging the bit line pairs to a predetermined voltage after an access to a memory cell; and
   a data line pair, for selectively coupling the bit line pairs to input/output circuitry;
   wherein, following an access to one of the plurality of memory cells, the bit line pairs are coupled to the data line pair for assisting a recharge of a bit line pair to the predetermined voltage.

10. The memory device of claim 9, further comprising a precharge circuit coupled to the data line pair, and responsive to a second control signal, wherein following an access to the memory cell coupled to the bit line pair, the data line pair is coupled to the bit line pair, and the plurality of bit line loads and the precharge circuit are used to recharge the bit line pair to the predetermined voltage.

11. The memory device of claim 9, wherein the memory device is characterized as being a static random access memory.

12. The memory device of claim 9, wherein the data line pair is characterized as being a read data line pair, the memory device further comprising a write data line pair, coupled to the bit line pairs, wherein after a write access to the memory cell, the read data line pair is coupled to the bit line pairs for assisting the recharge.

13. The memory device of claim 12, further comprising an equalization circuit coupled to each bit line pair of the bit line pairs, wherein the equalization circuit is activated at about the same time as the read data line pair is coupled to the bit line pairs.

14. The memory device of claim 9, wherein the predetermined voltage is equal to a power supply voltage.

15. The memory device of claim 9, further comprising a current conveying sense amplifier, coupled to the data line pair, for sensing a current in the data line pair.

16. The memory device of claim 15, further comprising a data line load, coupled to the data line pair, for providing a source for the current in the data line pair.

17. In a memory device having a plurality of memory cells coupled to word lines and to bit line pairs, each bit line pair having a corresponding bit line load, wherein a predetermined number of the bit line pairs are selectively coupled to a read data line pair, the read data line pair having a precharge and equalization circuit coupled thereto, a method for write recovery of a bit line pair of the predetermined number of the bit line pairs, the method comprising the steps of:
   coupling the read data line pair to the bit line pair of the predetermined number of the bit line pairs; and
   activating the precharge and equalization circuit such that both the bit line load and the precharge and equalization circuit are active at approximately the same time for recovering a voltage of the bit line pair and the read data line pair to a predetermined voltage.

18. The method of claim 17, wherein the step of coupling the read data line pair to bit line pair further comprises coupling the read data line pair to the predetermined number of the bit line pairs.

19. The method of claim 17, further comprising the step of sensing a current in the read data line pair during a read cycle of the memory device indicative of a stored logic state in a selected memory cell.

20. The method of claim 19, further comprising the step of providing a current source to the read data line pair for providing the current in the read data line pair.

* * * * *